United States Patent
Mori et al.

(10) Patent No.: US 6,754,549 B2
(45) Date of Patent: Jun. 22, 2004

(54) PARTS MOUNTING APPARATUS AND PARTS CHECKING METHOD BY THE SAME

(75) Inventors: Tetsuya Mori, Nakakoma-gun (JP); Takaaki Yokoi, Kofu (JP); Hiroshi Uchiyama, Kofu (JP); Kenji Kamakura, Kofu (JP)

(73) Assignee: Matsushita Electric Industrial Co., Ltd. (JP)

( * ) Notice: Subject to any disclaimer, the term of this patent is extended or adjusted under 35 U.S.C. 154(b) by 115 days.

(21) Appl. No.: 10/053,725

(22) Filed: Jan. 24, 2002

(65) Prior Publication Data

US 2002/0099468 A1 Jul. 25, 2002

(30) Foreign Application Priority Data

Jan. 24, 2001 (JP) ........................................ 2001-015138

(51) Int. Cl.[7] .......................... G06F 19/00; H05K 13/04
(52) U.S. Cl. ........................ 700/95; 700/90; 700/103; 700/106; 29/739; 716/8
(58) Field of Search .............................. 700/90, 95, 96, 700/103, 106, 117, 121; 29/739, 740; 716/8

(56) References Cited

U.S. PATENT DOCUMENTS

| | | | |
|---|---|---|---|
| 4,653,664 A | 3/1987 | Hineno et al. ................. 221/3 |
| 5,060,366 A | * 10/1991 | Asai et al. ..................... 29/739 |
| 5,228,193 A | * 7/1993 | Yanagawa et al. ............. 29/832 |

FOREIGN PATENT DOCUMENTS

EP    1 024 420 A1    8/2000

* cited by examiner

*Primary Examiner*—Jayprakash N. Gandhi
(74) *Attorney, Agent, or Firm*—Parkhurst & Wendel, L.L.P.

(57) ABSTRACT

The present invention allows a parts remaining number to be efficiently controlled using adaptability check result of an electronic part added during operation, and allows the electronic part to be mounted without mistake. For this object, the present invention includes: parts remaining number controlling means for monitoring a parts remaining number decreasing with mounting and for issuing warning of running out of part when a predetermined remaining number is reached; parts checking means for checking and confirming whether or not an added part for the part to which the warning of running out of part is issued or an added part when a kind is changed is a correct kind of part and for outputting check result and a parts adding number; and check result determining means for monitoring whether or not the check of the part to be taken out is finished when the mounting unit takes out the part from the part feeding means, confirming the check result when it is determined as finished, and renewing the parts remaining number based on the parts adding number when the check result is correct.

8 Claims, 7 Drawing Sheets

MOUNTING ORDER INFORMATION

| MOUNTING ORDER NUMBER | X COORDINATE (1/1000mm) | Y COODINATE (1/1000mm) | ANGLE (DEGREE) | FEEDING POSITION NUMBER |
|---|---|---|---|---|
| 1 | 10000 | 10000 | 0 | 4 |
| 2 | 20000 | 20000 | 0 | 1 |
| 3 | 30000 | 30000 | 0 | 2 |
| 4 | 40000 | 40000 | 0 | 7 |
| 5 | 50000 | 50000 | 0 | 6 |
| 6 | 60000 | 60000 | 0 | 10 |

FEEDING ARRANGEMENT INFORMATION

| FEEDING POSITION NUMBER | PART NAME |
|---|---|
| Z1 | 1005 |
| Z2 | 3216 |
| Z4 | TR |
| Z6 | SOP |
| Z7 | BGA |
| Z10 | QFP |

| FEEDING POSITION | USING FLAG | PART NAME | CHECK RESULT | NUMBER OF PARTS | WRITING FLAG |
|---|---|---|---|---|---|
| 1 | 1 : USED | 1005 | OK | 100 | 1 : CHECKED |
| 2 | 1 : USED | 3216 | UNCHECKED | 0 | 0 : UNCHECKED |
| 3 | 0 : UNUSED | | | | |
| 4 | 1 : USED | TR | OK | 350 | 1 : CHECKED |
| 5 | 0 : UNUSED | | | | |
| 6 | 1 : USED | SOP | UNCHECKED | 0 | 0 : UNCHECKED |
| 7 | 1 : USED | BGA | UNCHECKED | 0 | 0 : UNCHECKED |
| 8 | 0 : UNUSED | | | | |
| 9 | 0 : UNUSED | | | | |
| 1 0 | 1 : USED | QFP | NG | 200 | 1 : CHECKED |

PARTS MOUNTING APPARATUS AND PARTS CHECKING METHOD BY THE SAME

FIELD OF THE INVENTION

The present invention relates to a parts mounting apparatus for mounting parts such as electronic parts on a substrate, and more particularly to a parts mounting apparatus for checking added electronic parts during addition of the parts and for controlling mounting operation and to a parts checking method by the same.

BACKGROUND OF THE INVENTION

Figure 6:
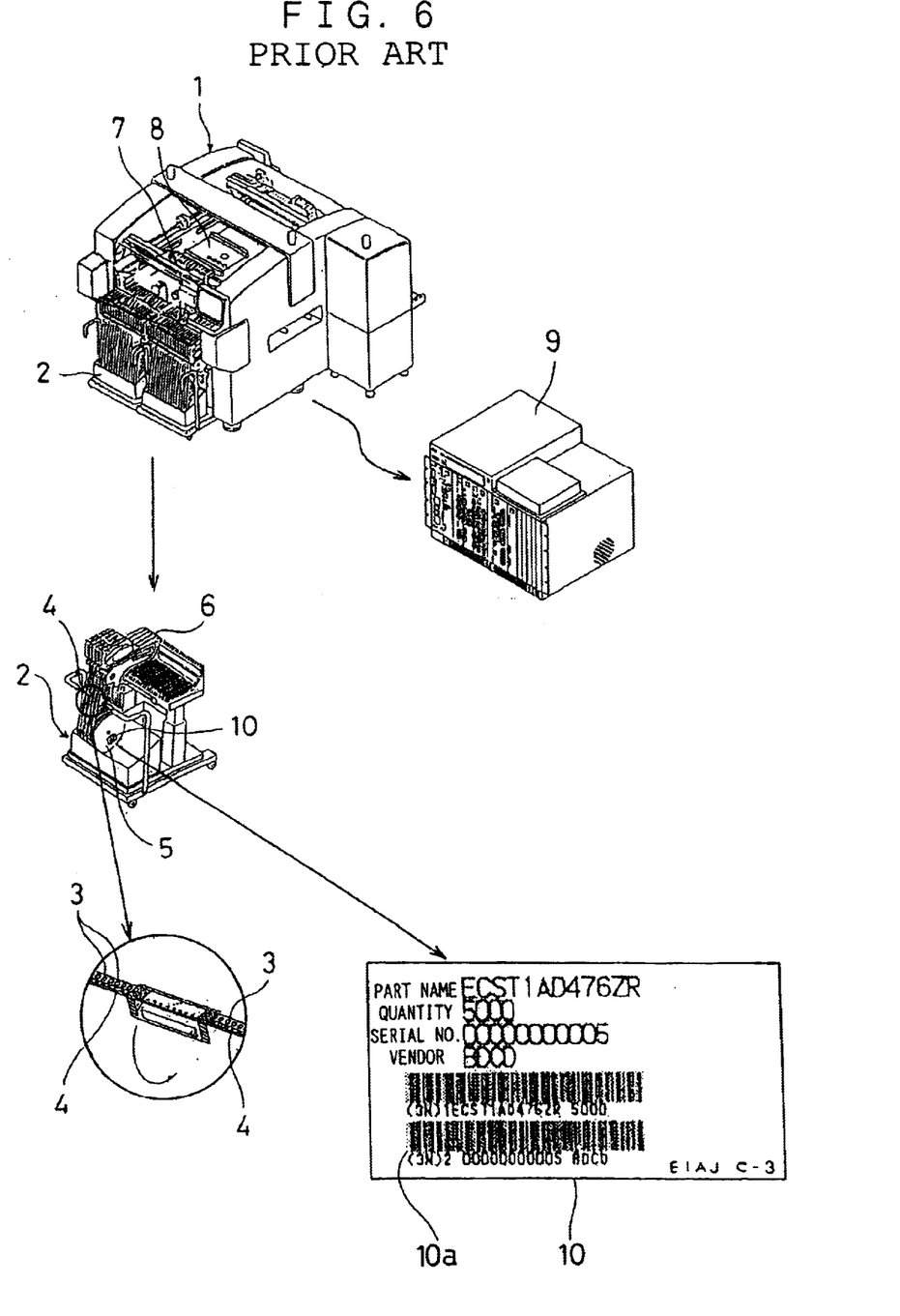
FIG. 6 is a schematic view of an entire configuration of a conventional electronic parts mounter.

As shown in FIG. 6, in an electronic parts mounter 1 for mounting an electronic part, a parts feeding unit 2 has a parts reel 5 arranged therein, around which a tape carrier package 4 (hereinafter referred to as a parts tape 4) is wounded that packs electronic parts 3 aligned for each kind. Each of the electronic part 3 fed from each parts reel 5 to a predetermined feeding position 6 is sucked by a nozzle (not shown) of a mounting unit 7 and mounted to a substrate 8. Reference numeral 9 denotes a controller that is configured to have a computer as a main unit and controls operations of the parts feeding unit 2 and the mounting unit 7.

When the parts feeding unit 2 runs out of the part or when a production substrate is changed, the parts mounter 1 is once stopped to replace the parts reel 5 with a parts reel 5 holding a necessary electronic part 3, and then mounting is restarted. In order to avoid addition errors of the electronic part 3, a label 10 indicating parts information such as characteristics (resistance to pressure, a temperature property, or the like), a value, a direction, a vendor, quantity, or a production lot of the electronic part 3 with a barcode 10a is attached to the parts reel 5 or a case thereof (not shown), and contents of the indication is read to check the electronic part 3.

Figure 7:
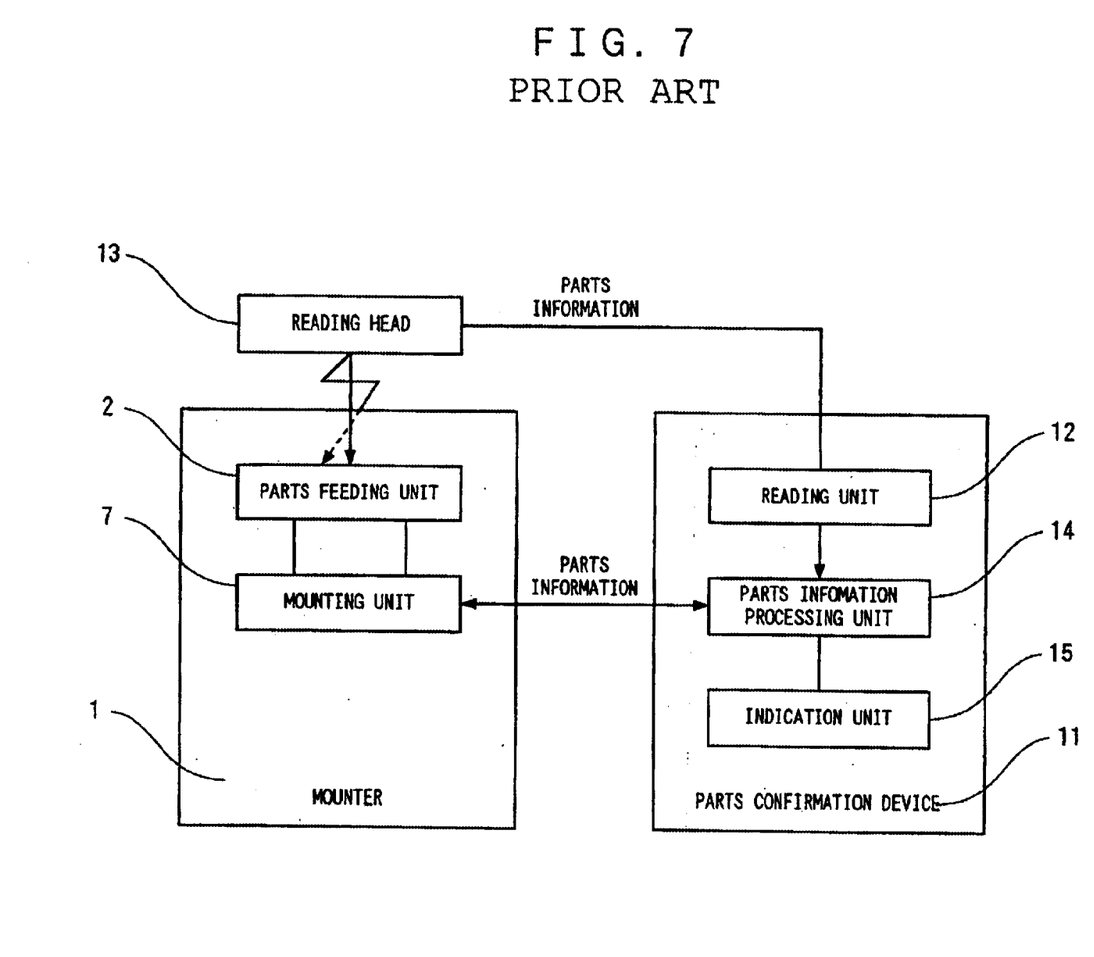
FIG. 7 is a block diagram for explaining conventional operation of the electronic parts mounter shown in FIG. 6.

For example, in the art described in JP63-232910A, as shown in FIG. 7, parts information is read from a barcode 10a of a parts reel 5 to be replaced by a reading head 13 connected to a reading unit 12 of a parts confirmation device 11, and sent to a parts information processing unit 14. Information on a part to be added is previously sent from the mounting unit 7 to the parts information processing unit 14, and based on this parts information, the parts information read by the reading head 13 is compared and determined. When it is determined that the electronic part to be added is added (in this case, when a correct parts reel 5 is located), data of quantity and a production lot of the electronic part is renewed in the parts information processing unit 14, and this renewed data is read into the mounting unit 7 to restart mounting. When a wrong electronic part is added, which is indicated by an indication unit 15, the parts reel 5 has to be replaced.

As described above, when the part runs out or when the kind of the production substrate is changed, there has been adopted a manner that the mounter 1 is stopped to check the part to be added and add it, and then operation of the mounter 1 is restarted. In recent years, to improve an operation rate, a parts adding manner has been also implemented that a new parts tape 4 is coupled to the parts tape 4 of the arranged parts reel 5 during operation of the mounter 1 to thereby prevent stop of the mounter 1 due to running out of the part.

However, if the electronic part 3 is added during operation of the mounter 1 as described above, when the addition part is checked by checking means such as the barcode 10a or the reading head 13, check result is read by the mounting unit 7 only during the stop of the mounter 1, and therefore timing of writing the check result obtained from the barcode 10a or the like is not necessarily followed by timing of reading the check result by the mounting unit 7. If the check result is written after the mounting unit 7 reads the check result, the mounting unit 7 cannot obtain correct information on the kind or a remaining number of the part, and thus there is a problem that it is likely to be determined by mistake that the part runs out to cause the mounter 1 to be stopped or cause a wrong electronic part 3 to be mounted.

Even when the mounter 1 is once stopped for parts addition, the above described problem also occurs unless the check result is written before the mounting unit 7 reads the check result at restart of operation.

There is also a problem that it is inefficient to refer to all the information on the check result during operation of the mounter 1 that operates at high speed.

DISCLOSURE OF THE INVENTION

The present invention is achieved to solve the above described problems and has an object to provide a parts mounting apparatus and a parts checking method by the same that can efficiently control a parts remaining number using a check result of an electronic part that is added and whose adaptability is checked during operation, and can efficiently mount the electronic part without mistake.

To solve the above described problems, according to the present invention, controlling the check result of the added part together with arrangement information of the part in a parts feeding unit allows a necessary check result to be referred to at any time as required during operation of the mounter.

The present invention provides a parts mounting apparatus in which a mounting unit takes out and mounts a part fed from a plurality of parts feeding means arranged in a part feeding unit, comprising: parts remaining number controlling means for monitoring a parts remaining number decreasing with mounting, and issuing warning of running out of part when a predetermined remaining number is reached; parts checking means for checking and confirming whether or not an added part for the part to which the above described warning of running out of part has been issued or a part added at a time of changing a kind of part is a correct kind of part, and outputting a check result and a parts adding number; and check result determining means for monitoring whether or not the check of a part to be taken out is finished when the mounting unit takes out the part from the part feeding means, confirming the check result when it is determined as finished, and renewing the parts remaining number based on the parts adding number when the check result is correct.

According to this configuration, the check result and the parts adding number in parts addition are stored in addition to arrangement information, and the added information is taken out by each electronic part as required, thereby allowing efficient control of the remaining number and efficient mounting of the electronic part without mistake.

Further, the present invention provides a parts checking method of parts feeding means arranged in a parts feeding unit by a parts mounting apparatus in which a mounting unit takes out and mounts a part fed from a plurality of parts feeding means arranged in the part feeding unit, comprising: monitoring a part remaining number decreasing with mounting, and issuing warning of running out of part when a predetermined remaining number is reached; checking and confirming whether or not an added part for the part to which the above described warning of running out of part has been issued or a part added at a time of changing a kind of part is a correct kind of part, and outputting a check result and a parts adding number; and monitoring whether or not the check of the part to be taken out is finished when the mounting unit takes out the part from the parts feeding means, confirming the check result when the check is determined as finished, and renewing the parts remaining number based on the parts adding number when the check result is correct. According to this configuration, time required for reading the check result can be reduced.

DESCRIPTION OF THE EMBODIMENT

An embodiment of the present invention will be described below with reference to the drawings.

A schematic configuration of an electronic parts mounter according to Embodiment 1 of the present invention is shown in FIG. 6. The configuration is substantially the same as a conventional configuration except for an inner configuration of a controller 9. As shown in the drawing, a parts feeding unit 2 is formed on a carriage and can be removed and replaced collectively by each group consisting of a plurality of parts reels. Thus, when a part runs out in a certain group, a part can be fed by other groups to continue production, while the parts feeding unit 2 of the group where the part runs out can be drawn to add the part therein. Parts used in different production kinds are arranged in the respective groups of the parts feeding unit 2, and in changing the production kind, the group for feeding can be changed to reduce loss in changing the kind.

The parts feeding unit 2 holds a parts reel 5 in a holding case 30 located therebelow, and a parts tape 4 is extended to a feeding position 6 located above. When the part almost runs out, the parts reel 5 to which the part is added is held in the holding case 30, and a tip of the parts tape 4 of the parts reel 5 to which the part is added as shown in FIG. 6 is connected to an end of the parts tape 4 almost running out of the part. This allows continuous operation without stop due to running out of the part.

Figure 1:
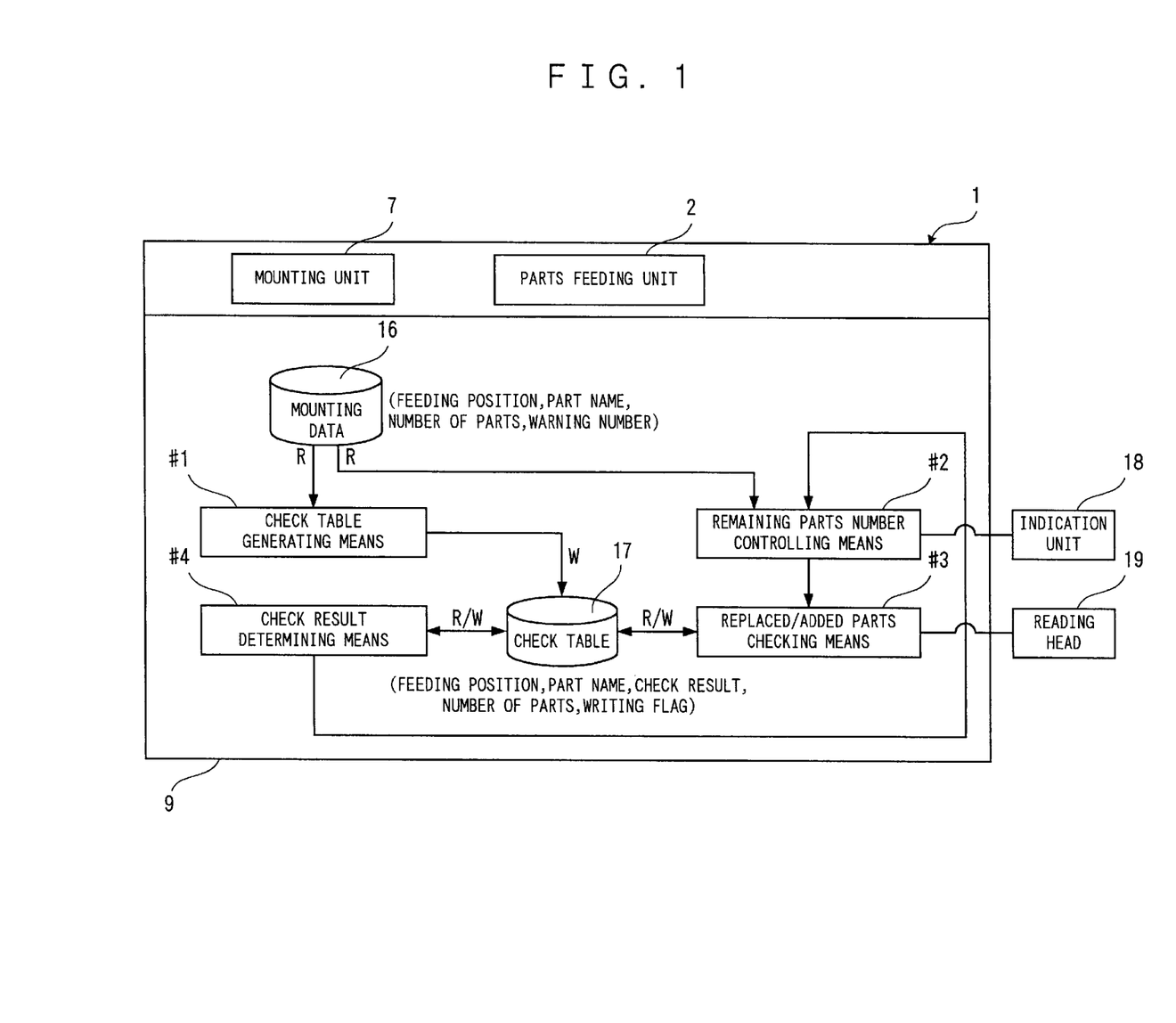
FIG. 1 is a block diagram for explaining a schematic configuration of an electronic parts mounter according to a first embodiment of the present invention.

FIG. 1 is a block diagram showing a schematic entire configuration of a control system of the electronic parts mounter according to Embodiment 1 of the present invention.

Reference numeral 1 denotes a parts mounter; 2, a parts feeding unit; and 7, a mounting unit. Reference numeral 9 denotes a controller having a characteristic functional configuration of the present invention; 18, an indication unit such as a display screen or a signal tower; and 19, a reading head for reading a barcode 10a of a label 10 attached to the parts reel 5.

A block configuration in the controller 9 will be described below.

Reference numeral 16 denotes mounting data stored in the mounting unit 7, and "Feeding position (number)", "Part name", "Number of parts" and "Warning number" of the electronic part 3 arranged in the parts feeding unit 2 are registered in the data. The feeding position of the electronic part 3 is equivalent to an arrangement position of the parts reel 5 in the parts feeding unit 2, the number of parts is the number of parts held in the parts reel 5 in mounting, and the warning number is the number of parts to which warning is issued when a remaining number reaches less than that. For example, as the warning number, the number of parts is set in such a manner that time is expected that is required for adding and checking the part after the issue of warning and that the part does not run out at least before the time passes.

Reference numeral #1 denotes check table generating means (arrangement information generating means), which reads "Feeding position" and "Number of parts" from the mounting data 16 in changing the production kind, and registers the information as an initial value in a check table 17 (check storing unit) that refers to the information in replacing the part.

Reference numeral #2 denotes parts remaining number controlling means, which stores a parts remaining number, and with "Number of parts" previously registered in the mounting data 16 as an initial value, substrates the number of use from the initial value, and when "Warning number" or less of the mounting data 16 is reached, shows an operator warning that parts checking operation should be performed with the indication unit 18 such as a message or the signal tower.

Reference numeral #3 denotes replaced/added parts checking means (parts checking means) to which a reading head 19 or the like is connected, which reads a part name barcode 10a of the label 10 attached to the parts reel 5 and checks whether the replaced/added part is correct when the operator has to replace/add the electronic part 3 such as when the operator replaces/adds the electronic part 3 in accordance with the warning by the parts remaining number controlling means #2 or by watching a state of the parts reel 5, or when the kind is changed. When the electronic part 3 is replaced/added in accordance with the warning by the parts remaining number controlling means #2, the part name barcode 10a of the label 10 attached to the parts reel 5 of the electronic part 3 and a part name barcode 10a of a label 10 attached to a parts reel 5 to be newly mounted by replacement are read, compared and checked. When the operator replaces/adds the electronic part 3 due to the change of the kind, the feeding position (number) of the electronic part 3 is designated, a part name barcode 10a of a label 10 attached to a parts reel 5 to be newly arranged in the feeding position is read to check whether the replaced/added part is correct. In this case, the name of the part to be arranged in each feeding position is stored in the check table 17, and thus the part name in each feeding position and the part name read by the reading head 19 are compared and checked.

Check with the part name in the check table as described above may be naturally performed in the addition due to running out of the part.

The replaced/added parts checking means #3 writes OK/NG in "Check result" blanks in the check table 17 after the comparison and check, and sets "Writing flag (parts added information)" showing the number of parts and that the parts are added. When the writing flag is already set and check information set before is not used, writing is suspended. When the part is added to a parts reel 5 that is in use and has remaining parts, the operator writes "Number of parts".

For the number of parts, if the barcode of the parts reel 5 includes the number of parts, the value is set in the check table 17 as a true value.

Reference numeral #4 denotes check result determining means, which reads, from the check table 17, "Check result"

of a feeding position to which the part is to be attached by a nozzle of the mounting unit 7 at start of mounting operation or before suction of the part, and renews the remaining number of the parts remaining number controlling means #2 using the value of "Number of parts" if "Number of parts" is written, and using the value of "Number of parts" registered in the mounting data 16 if "Number of parts" is not written when "Check result" is OK. When "Check result" is NG, mounting operation of the mounting unit 7 is stopped. Then, "Check result", "Number of parts", and "Writing flag" in the check table 17 are cleared.

The above described check table generating means #1, parts remaining number controlling means #2, added parts checking means #3, check result determining means #4, and check table 17 are provided in the controller 9 in a body of the electronic parts mounter 1 having a computer as a main unit.

Operation of the electronic parts mounter 1 controlled as described above will be described below in detail.

Figure 2:
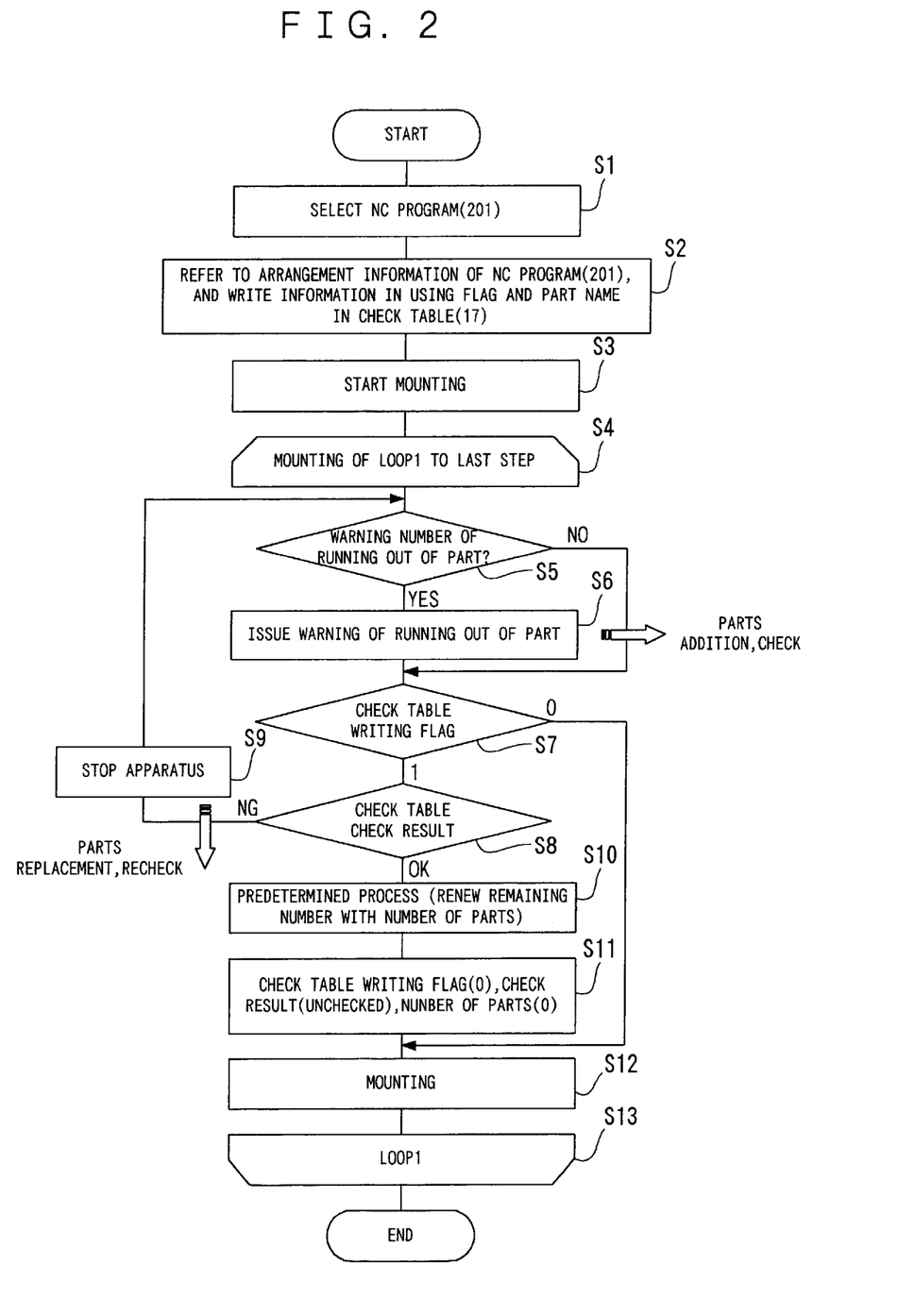
FIG. 2 is a flowchart for explaining operation of the electronic parts mounter.
Figure 3:
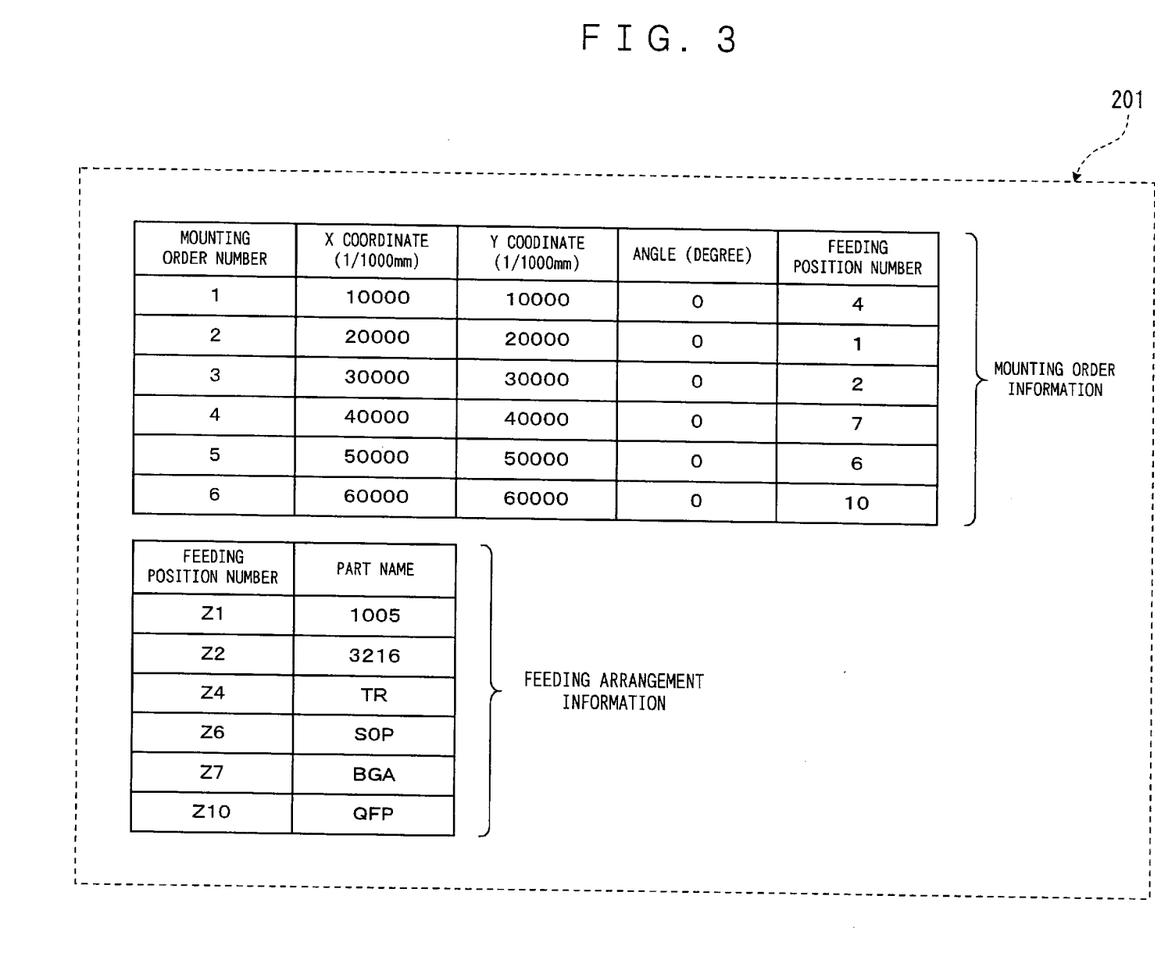
FIG. 3 is a control program used in the electronic parts mounter.

As shown in FIG. 2, the operator selects an NC program 201 in S1. The NC program 201 is an example of the mounting data 16 as shown in FIG. 3, and mounting order information for the mounting unit 7, that is, data showing that parts fed to designated feeding positions (numbers) should be successively mounted to mounting coordinates (X, Y, angle) in order of designated mounting numbers, and feeding arrangement information for the parts feeding unit 2, that is, data showing that the designated parts should be fed to the designated feeding parts (numbers).

Contents of the selected NC program 201 are stored as the mounting data 16.

Figure 4:
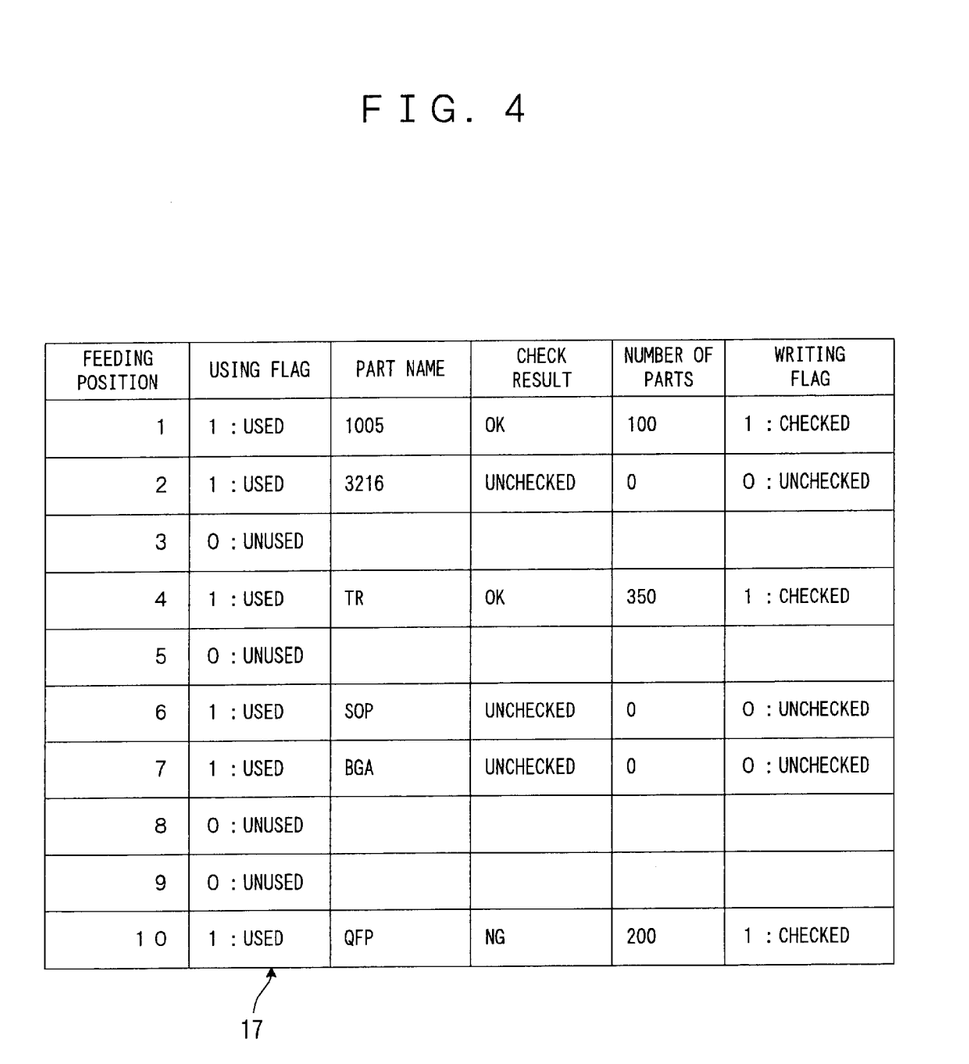
FIG. 4 is a check result table generated in parts addition in the electronic parts mounter.

In S2, the check table generating means #1 refers to the feeding arrangement information of the NC program 201 stored in the mounting data 16, and writes information on using flags and part names in the check table 17 as shown in FIG. 4. For example, programmed in a first line of the feeding arrangement information of the NC program 201 in FIG. 3 is as feeding position number: Z1 and part name: 1005, and thus the using flag blank of the feeding position number (1) is filled with "1: used", and the part name blank is filled with "1005" as shown in FIG. 4.

When writing in the check table 17 is finished in S2, the mounting unit 7 is instructed to start mounting in S3, and to perform mounting of LOOP1 to the last step in S4.

Each part set in the parts feeding unit 2 at this time has been checked and the correct part is set.

Figure 5:
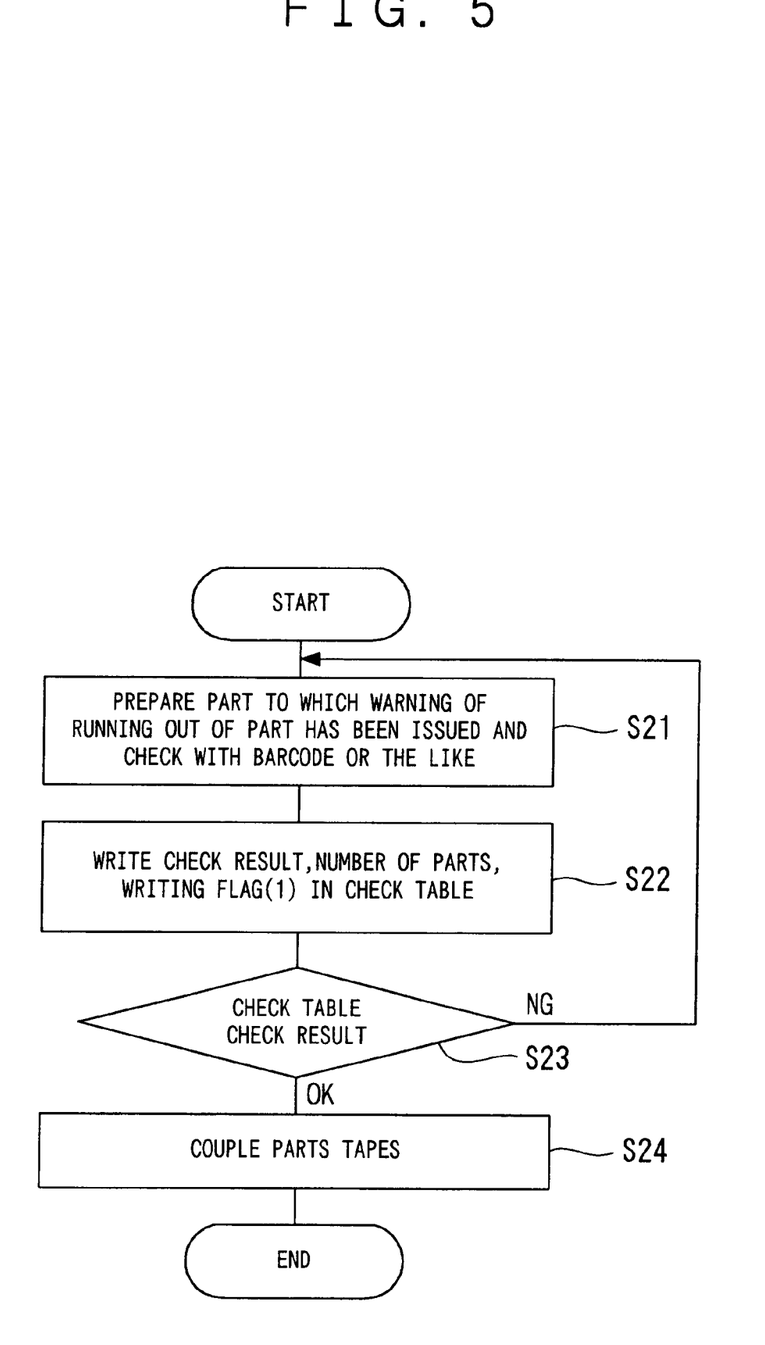
FIG. 5 is a flowchart for explaining the parts addition performed in the electronic parts mounter.

In S5, the parts remaining number controlling means #2 determines whether there is an electronic part that reaches the warning number of running out of part. For example, the mounting unit 7 successively takes out the parts of the feeding position numbers in accordance with the mounting order of the data in the mounting data 16, and the determination is performed for the part of the feeding position for taking out. In this case, the number of parts taken out is subtracted from the remaining number, and thus it is determined whether the warning number of running out of part is reached. If determination result is YES, warning of running out of part is issued from the indication unit 18 in S6. In this case, the operator performs part addition and check without stop of the mounter 1. A flow of the parts addition and check is shown in FIG. 5. As shown in FIG. 5, the operator prepares the parts reel 5 of the electronic part 3 to which warning of running out of part is issued. The added parts checking means #3 reading the barcode or the like checks the parts reel 5 to which the warning of running out of part is issued and a newly prepared parts reel 5, and writes OK/NG in a check result blank, the number of parts in the number of parts blank, and (1) in the writing flag blank in the check table 17 in S22.

In S23, the check result determining means #4 determines the check result written in the check table 17. When the check result is NG as the electronic part 3 of the feeding position number (10), the steps S21, S22, S23 are repeated. When the check result is OK as the electronic part 3 of the feeding position number (1), the operator couples a free end of a parts tape 4 of the prepared parts reel 5 to a free end of the parts tape 4 of the parts reel 5 to which the warning of running out of part is issued in S24 (see the drawing in a circle in the lower left of FIG. 6).

In this way, the mounter 1 continues mounting the parts even during the parts addition and check. The parts to which the warning of running out of part is issued in S5 are also taken out and mounted to the substrate until parts coefficient reaches zero. When there is no electronic part that reaches the warning number of running out of part during the parts addition and check or in S5, the check result determining means #4 refers to the writing flag in the check table 17 concerning the feeding position designated in the mounting order information of the NC program 201 in S7.

In this case, the check result is not written in the check table 17, that is, the writing flag in the check table 17 is (0), and thus a process directly proceeds to S12 for mounting by the mounting unit 7. The writing flag (1) shows that the writing flag is set, and the writing flag (0) shows that the writing flag is not set.

When the check result determining means #4 refers to the writing flag in the check table 17 in S7 after the parts addition and check are finished, the writing flag is (1). In this case, the check result determining means #4 refers to the check result in the check table 17 in S8. If the check result is NG, the mounting unit 7 is stopped in S9 since a wrong part is added even though the parts addition and check are performed. In this case, the steps S5, S6, S7 and S8 are repeated.

If the check result of the reference in S8 is OK, the parts remaining number of the parts remaining number controlling means #2 is renewed in the above described predetermined process in S10. In S1, the writing flag blank in the check table 17 is cleared to (0), the check result blank is cleared to (unchecked), and the number of parts blank is cleared to (0) (see the feeding position number (2)). Then, the mounting unit 7 is operated to mount the electronic part 3 in S12.

Such steps S5 to S12 are repeated in accordance with the NC program 201, and when mounting of LOOP1 reaches the last step in S13, production is finished.

In this way, the check result of whether or not the parts addition is correctly performed is temporarily stored in the check table 17, the writing flag shows whether or not the check result is written and is referred to concerning the electronic part 3 to be used, and the check result is read only when the writing flag is set to (1), so that the steps S8 to S11 can be omitted to allow prompt reading.

Thus, the parts addition and check can be performed without stop of the mounter 1, and the apparatus (mounting) can be stopped when the check result is NG as is conventional, and further, the parts remaining number can be promptly renewed when the check result is OK, thereby allowing the parts remaining number to be precisely controlled to issue the warning of running out of part.

Therefore, prompt parts addition in accordance with the warning allows reduction in frequency of stop of the mounting unit 7, thereby achieving improvement in production efficiency.

The mounter 1 may be once stopped and then restarted during the parts addition and check after the warning of running out of part. The same advantage as described above can be also obtained in this case.

Further, in such a case, the present invention can be applied not only to the above described structure where addition is performed by connecting the tape, but also to a structure where parts feeding means such as a parts cassette disposed in the parts feeding unit 2 is replaced. Further, the present invention can be applied not only to the structure where the parts feeding means is replaced in accordance with the warning of running out of part, but also to a structure where the parts feeding means is replaced in accordance with change of the kind.

The writing flag is not essential, and even in a manner that information on the check result and the parts addition number stored in addition to the arrangement information is taken out by each electronic part as required as described above without the writing flag, the check result determining means #4 determines that the part name is not changed to a wrong one or that the parts remaining number is not rewritten in the check table 17 concerning the part to be taken out, thereby allowing the remaining number to be controlled promptly and efficiently. However, the writing flag is advantageous when the check result data of the same feeding position is transferred several times by mistake or for reduction in search time in determination of the check result.

The above described parts remaining number controlling means #2 issues the warning based on the parts remaining number, but alternatively, the state of the parts reel 5 may be monitored by a sensor or the like to issue warning based on presence or thickness of the wound parts tape 4.

Further, the check table generating means #1, parts remaining number controlling means #2, added parts checking means #3, check result determining means #4 and check table 17 may be assembled as a separate apparatus that is operated by software independent of that of the body of the electronic parts mounter 1.

The parts remaining number may be similarly controlled in an electronic parts mounter configured to have a tray with a plurality of aligned electronic parts 3 arranged in the parts feeding unit 2 instead of the above described parts reel 5.

According to the above described configuration of the present invention, the check result of whether or not the parts addition is correctly performed is temporarily stored in the check table, and the check result of the electronic part to be used only is read, so that the parts remaining number can be controlled precisely and efficiently, thus preventing stop of mounting due to running out of the part, and allowing mounting of a correct electronic part with high efficiency.

What is claimed is:

1. A parts mounting apparatus comprising:

a mounting unit;

a parts feeding unit;

a plurality of parts feeding means, wherein the mounting unit is for retrieving and mounting parts fed from the plurality of parts feeding means located in the part feeding unit, the parts mounting apparatus additionally comprising:

parts remaining number controlling means for monitoring a parts remaining number that decreases as parts are mounted, and for issuing a part depletion warning when a predetermined remaining number of parts is reached;

parts checking means for checking and confirming that a correct part is added in response to a part depletion warning or when a kind of a part to be mounted is changed, and outputting a check result and a parts adding number; and check result determining means for monitoring completion of checking a part to be retrieved when the mounting unit retrieves a part from the part feeding means, for confirming the check result when the check is determined to be finished, and for updating the parts remaining number based on the parts adding number when the check result is correct.

2. The parts mounting apparatus according to claim 1, wherein the check result determining means is for instructing the mounting unit to stop mounting parts when the check result is incorrect.

3. The parts mounting apparatus according to claim 1, wherein the check result determining means is for instructing the mounting unit to continue using a part for which a part depletion warning has been issued when the checking of a part to be retrieved is determined to be unfinished.

4. The parts mounting apparatus according to claim 1, further comprising a check storing unit, wherein the parts checking means is for storing the check result and the parts adding number in the check storing unit, and the check result determining means is for determining that the checking of a part to be retrieved is finished when the check result is stored in the check storing unit.

5. The parts mounting apparatus according to claim 1, wherein the parts checking means is for storing in the check storing unit parts added information together with the check result and the parts adding number, and the check result determining means is for determining that the checking of a part to be retrieved is finished when the parts added information is stored in the check storing unit.

6. The parts mounting apparatus according to claim 1, further comprising arrangement information generating means for generating arrangement information in the parts feeding unit for a part used in a product, and for storing the information in the check storing unit, wherein the parts checking means is for writing the check result and the parts adding number for a corresponding part in the arrangement information in the check storing unit, and the check result determining means is for referring for a part to be retrieved from the parts feeding means by the mounting unit, to the check result of a corresponding part in the arrangement information in the check storing unit.

7. The parts mounting apparatus according to claim 1, wherein the parts checking means is for reading and checking a barcode attached to the parts feeding means and an associated part name.

8. A parts checking method for parts feeding means located in a parts feeding unit in a parts mounting apparatus in which a mounting unit is for retrieving and mounting parts fed from a plurality of parts feeding means located in the part feeding unit, the method comprising:

monitoring a parts remaining number that decreases as parts are mounted and issuing a part depletion warning when a predetermined remaining number is reached;

checking and confirming that a correct part is added in response to a part depletion warning when a kind of part to be mounted is changed, and outputting a check result and a parts adding number; and monitoring completion of checking a part to be retrieved when the mounting unit retrieves a part from the parts feeding means, confirming the check result when the check is determined to be finished, and updating the parts remaining number based on the parts adding number when the check result is correct.

* * * * *